US008008581B2

(12) United States Patent
Nawata

(10) Patent No.: US 8,008,581 B2
(45) Date of Patent: Aug. 30, 2011

(54) CIRCUIT BOARD, ELECTRONIC DEVICE INCLUDING A CIRCUIT BOARD, AND METHOD OF MANUFACTURING A CIRCUIT BOARD

(75) Inventor: Tomohiko Nawata, Yokohama (JP); Makiko Nawata, legal representative, Yokohama (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/466,942

(22) Filed: Aug. 24, 2006

(65) Prior Publication Data
US 2007/0103182 A1 May 10, 2007

(30) Foreign Application Priority Data
Aug. 29, 2005 (JP) .................. 2005-248449

(51) Int. Cl.
H05K 1/03 (2006.01)
(52) U.S. Cl. ...................... 174/255; 174/260
(58) Field of Classification Search .................. 174/260, 174/261, 254, 255
See application file for complete search history.

(56) References Cited

U.S. PATENT DOCUMENTS

| 5,308,928 | A  | * | 5/1994  | Parla et al. ............... 174/261 |
| 6,194,667 | B1 | * | 2/2001  | Jimarez et al. ............ 174/261 |
| 6,218,630 | B1 | * | 4/2001  | Takigami .................. 174/261 |
| 6,228,466 | B1 | * | 5/2001  | Tsukada et al. ........... 428/209 |
| 6,566,611 | B2 | * | 5/2003  | Kochanowski et al. .... 174/261 |
| 6,646,349 | B1 |   | 11/2003 | Pu et al. |
| 6,717,068 | B2 | * | 4/2004  | Motonishi et al. ......... 174/261 |
| 6,940,023 | B2 | * | 9/2005  | Ishizuka et al. ........... 174/260 |
| 7,005,750 | B2 | * | 2/2006  | Liu ........................... 257/779 |
| 7,199,304 | B2 | * | 4/2007  | Wienrich et al. .......... 174/254 |
| 7,410,093 | B2 | * | 8/2008  | Miller et al. .............. 228/260 |
| 2003/0150101 | A1 |   | 8/2003 | Park et al. |
| 2005/0103828 | A1 |   | 5/2005 | Miller et al. |
| 2005/0248037 | A1 | * | 11/2005 | Hung et al. ............... 257/778 |

FOREIGN PATENT DOCUMENTS

| JP | 55015331   | Y2 |   | 4/1980  |
| JP | 62158367   | U  |   | 10/1987 |
| JP | 07-086729  |    |   | 3/1995  |
| JP | 407074455  | A  | * | 3/1995  |
| JP | 3010647    | U  |   | 5/1995  |
| JP | 09199819   | A  |   | 7/1997  |

(Continued)

OTHER PUBLICATIONS

Korean Office Action for corresponding Korean application No. 10-2006-0080977 lists the references above.

(Continued)

Primary Examiner — Ishwar (I. B.) Patel
(74) Attorney, Agent, or Firm — DLA Piper LLP (US)

(57) ABSTRACT

A circuit board includes a board, a first conductive pad provided on the board, a second conductive pad provided with a first distance from the first conductive pad. A mask extends over the board and has an opening that extends over at least a part of the first conductive pad, at least a part of the second conductive pad, and at least a part of an intervening region of the board between the first and second conductive pads. A conductive material is provided in the opening, and extends over the at least a part of the first conductive pad, the at least a part of the intervening region, and the at least a part of the second conductive pad.

6 Claims, 10 Drawing Sheets

FOREIGN PATENT DOCUMENTS

| | | |
|---|---|---|
| JP | 2002124620 A | 4/2002 |
| JP | 2002280693 A | 9/2002 |
| KR | 20030046552 A | 6/2003 |

OTHER PUBLICATIONS

Chinese Office Action for corresponding Chinese Patent Application No. 200610126230.8, list the reference above.

Chinese language office action dated Mar. 15, 2010 and its English language translation for corresponding Chinese application 2010031000821520 lists the reference above.

Japanese language office action dated Sep. 21, 2010and its English language translation for corresponding Japanese application 2005248449 lists the references above.

\* cited by examiner

CIRCUIT BOARD, ELECTRONIC DEVICE INCLUDING A CIRCUIT BOARD, AND METHOD OF MANUFACTURING A CIRCUIT BOARD

BACKGROUND OF THE INVENTION

1. Field of the Invention

The present invention generally relates to a circuit board having a predetermined circuit pattern, an electronic device including the circuit board, and a method of manufacturing a circuit board.

Priority is claimed on Japanese Patent Application No. 2005-248449, filed Aug. 29, 2005, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

Generally, processes for manufacturing circuit boards may include, but are not limited to, the following three processes. The first process is to design a circuit that is formed over a board, thereby determining design values of a circuit. The second process is to manufacture a circuit board based on the design values. The third process is to carry out a predetermined set of tests for the manufactured circuit board. When any design deficiency of the circuit board is confirmed by the tests, the circuit design is changed to determine new design values of the circuit, followed by the above-described second and third processes. The above-described first to third processes will be repeated until no design deficiency is confirmed by the tests.

In order to make it easy to test the circuit board, the following techniques have been used. In the process of circuit design, a circuit including a zero-ohm resistance is designed. In the test process, the zero-ohm resistance is used to form a short circuit or is used to allow detecting a current across the zero-ohm resistance. The zero-ohm resistance can typically be realized by a relative element that has an extremely low resistance and has a shape similar to a chip resistance or a lead-type resistance.

The zero-ohm resistance is not needed for a circuit configuration. In this point of view, it would be preferable to eliminate or delete the used zero-ohm resistance for carrying out a mass production of the circuit board after the design of the circuit board has been completed. In the opposite point of view, the zero-ohm resistance can be used again to detect any deficiency of the circuit board in the mass production processes. Actually, however, the mass production of the circuit board including the zero-ohm resistance can often be carried out. Japanese Unexamined Patent Application, First Publication, No. 7-86729 discloses a conventional technique for mounting the zero-ohm resistance on the circuit board.

As described above, the mass production of the circuit board, on which the zero-ohm resistance is mounted, is advantageous in view of making it easy to carry out the test of the circuit board, but is disadvantageous in view of increased total cost of the circuit board. The increase of the total cost is caused by an additional cost of the zero-ohm resistance and another additional cost of mounting the zero-ohm resistance on the circuit board. In general, a rate of defective in mounting the zero-ohm resistance is approximately equal to that in mounting a variety of other circuit elements. Increasing the number of the zero-ohm resistance to be mounted on the circuit board can decrease the manufacturing yield of the circuit board.

An alternative proposal can be made for designing the circuit board without using the zero-ohm resistance even the convenience of the test is sacrificed. In this case, however, if any defectiveness of the circuit board occurs, investigating one or more defective portions of the circuit board needs an additional process for cutting a circuit pattern. This additional process can provide a considerable stress to the circuit board. Even if the defective portion was recovered through the additional process, such considerable stress can render the circuit board unavailable.

In view of the above, it will be apparent to those skilled in the art from this disclosure that there exists a need for an improved circuit board, an improved electronic device, and an improved method of manufacturing a circuit board. This invention addresses this need in the art as well as other needs, which will become apparent to those skilled in the art from this disclosure.

SUMMARY OF THE INVENTION

Accordingly, it is a primary object of the present invention to provide a circuit board suitable for facilitating the tests.

It is another object of the present invention to provide a circuit board suitable for reducing the cost.

It is a further object of the present invention to provide a circuit board suitable for improving the yield.

It is a still further object of the present invention to provide an electronic device including a circuit board suitable for facilitating the tests.

It is yet a further object of the present invention to provide an electronic device including a circuit board suitable for reducing the cost.

It is an additional object of the present invention to provide an electronic device including a circuit board suitable for improving the yield.

It is another object of the present invention to provide a method of manufacturing a circuit board suitable for facilitating the tests.

It is still another object of the present invention to provide a method of manufacturing a circuit board suitable for reducing the cost.

It is yet another object of the present invention to provide a method of manufacturing a circuit board suitable for improving the yield.

In accordance with a first aspect of the present invention, a circuit board may include a board, a first conductive pad provided on the board, a second conductive pad provided with a first distance from the first conductive pad, a mask extending over the board and having an opening that extends over at least a part of the first conductive pad, at least a part of the second conductive pad, and at least a part of an intervening region of the board between the first and second conductive pads, and a conductive material provided in the opening, and extending over the at least a part of the first conductive pad, the at least a part of the intervening region, and the at least a part of the second conductive pad.

Preferably, the conductive material may include a solder. Preferably, the solder can be provided by reflow. Preferably, the circuit board may further include a first mounting pad provided on the board, and a second mounting pad provided with a second distance from the first mounting pad on the board, wherein the first distance is narrower than the second distance.

Preferably, the opening may have a first center axis and a second center axis that is perpendicular to the first center axis. The opening may have a circumference being defined by a locus of points having a third distance from the second center axis and a fourth distance from the first center axis. The third distance is defined in parallel to the first center axis. The fourth distance is defined in parallel to the second center axis. The third distance simply decreases while the fourth distance simply increases. The third distance simply increases while the fourth distance simply decreases.

Preferably, the first and second center axes cross to each other at a center position that is positioned in the intervening region.

Preferably, the opening may have a circular shape or an elliptical shape.

In accordance with a second aspect of the present invention, an electronic device may include a casing that contains a circuit board that further includes a board, a first conductive pad provided on the board, a second conductive pad provided with a first distance from the first conductive pad on the board, a first mask extending on the board and having an opening that extends over at least a part of the first conductive pad, at least a part of the second conductive pad, and at least a part of a first intervening region of the board between the first and second conductive pads, a conductive material provided in the opening, and extending over the at least a part of the conductive pad, the at least a part of the first intervening region, and the at least a part of the second conductive pad.

In accordance with a third aspect of the present invention, a method of forming a circuit board may include preparing a board having first and second conductive pads with separation of a first distance between the first and second conductive pads from each other, forming a first mask extending on the board, the first mask having a first opening that extends over at least a part of the first conductive pad, at least a part of the second conductive pad, and at least a part of an intervening region of the board between the first and second conductive pads, and forming a first conductive material within the first opening, with extending over the at least a part of the first conductive pad, the at least a part of the intervening region, and the at least a part of the second conductive pad.

Preferably, the first conductive material may include a solder. Preferably, the first conductive material can be provided by reflow. Preferably, preparing the board may include preparing the board that has the first and second mounting pads with separation of a second distance between the first and second mounting pads from each other, and wherein the first distance is narrower than the second distance.

Preferably, forming the first mask comprises forming the first mask having the first opening that has a first center axis and a second center axis that is perpendicular to the first center axis. The first opening has a circumference being defined by a locus of points having a third distance from the second center axis and a fourth distance from the first center axis. The third distance is defined in parallel to the first center axis. The fourth distance is defined in parallel to the second center axis. The third distance simply decreases while the fourth distance simply increases, and the third distance simply increases while the fourth distance simply decreases.

Preferably, the first and second center axes cross to each other at a center position that is positioned in the intervening region.

Preferably, the first opening has a circular shape or an elliptical shape.

Preferably, forming the first conductive material comprises performing a reflow of the first conductive material using a mask stencil that has a second opening being similar in shape to the first opening of the first mask.

Preferably, the method may further comprise forming a second conductive material over the first and second mounting pads by performing the reflow using the mask stencil at the same time of forming the first conductive material in the first opening, and wherein the mask stencil further has a third opening which is similar in shape to each of the first and second mounting pads and use for forming the second conductive material.

Preferably, the mask stencil has a thickness which is larger than the first distance at an edge of the second opening.

Preferably, the second opening is larger in size than the first opening.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1A:
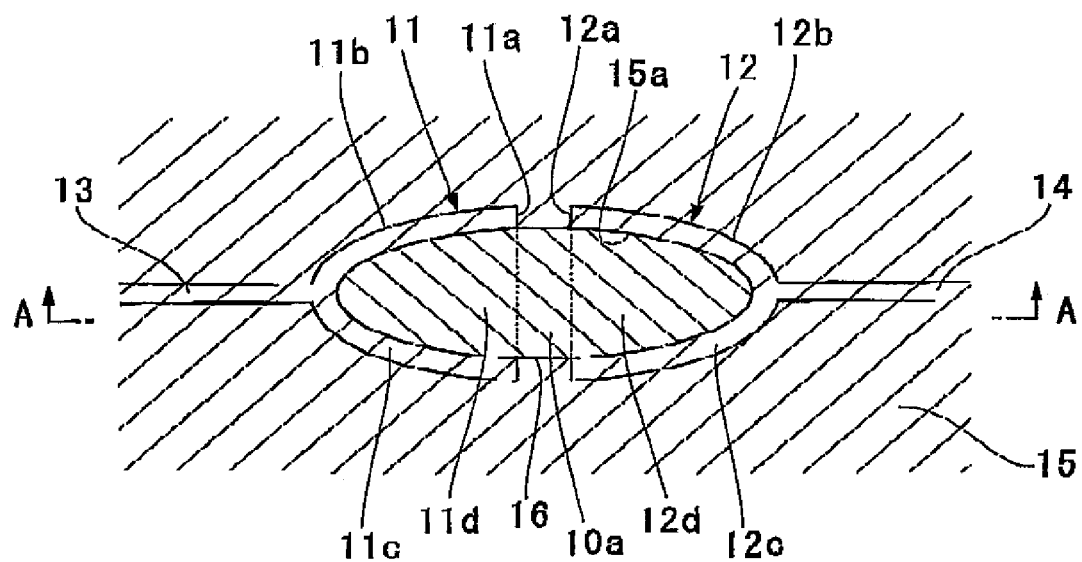
FIG. 1A is a fragmentary perspective plan view illustrating a circuit board including a pad structure in accordance with a first embodiment of the present invention.
Figure 1B:
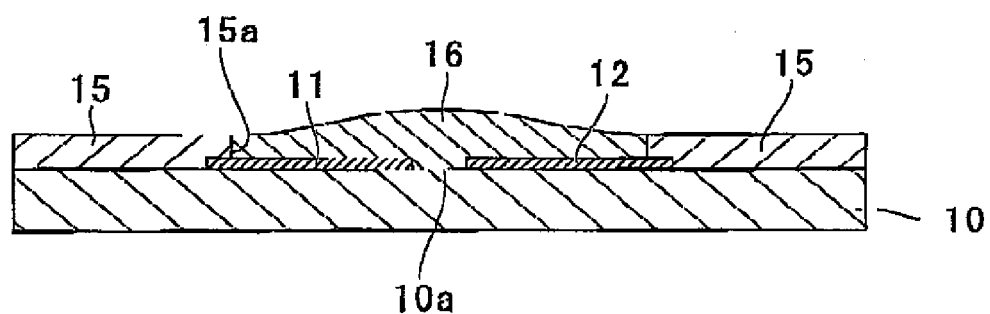
FIG. 1B is a fragmentary cross sectional elevation view, taken along an A-A line of FIG. 1A.

FIG. 1A is a fragmentary perspective plan view illustrating a circuit board including a pad structure in accordance with a first embodiment of the present invention. FIG. 1B is a fragmentary cross sectional elevation view, taken along an A-A line of FIG. 1A. A circuit board may include, but is not limited to, a board 10, a pair of first and second pads 11 and 12, first and second wirings 13 and 14, a solder mask 15, and a solder 16. The first and second pads 11 and 12 are provided on the board 10. Each of the first and second pads 11 and 12 has an electrical conductivity. The first and second pads 11 and 12 are distanced from each other at a predetermined distance. The first pad 11 is electrically connected to the first wiring 13. The second pad 12 is also electrically connected to the second wiring 14. The first and second wirings 13 and 14 extend over the board 10. Each of the first and second pads 11 and 12 and the first and second wirings 13 and 14 can be made of a conductive material such as a metal. Typical examples of the conductive material may include, but is not limited to, copper (Cu) and gold (Au). A copper plated layer or a gold plated layer can be used.

The first and second pads 11 and 12 are used as a test point for carrying out the test of the circuit board. The first and second pads 11 and 12 are also used as portions of a predetermined circuit pattern except when the test is carried out. Each of the first and second pads 11 and 12 has a shape of semi-ellipse in plan view. Namely, the first pad 11 is defined by a first straight edge 11a and a first semi-elliptically curved edge 11b. The second pad 12 is defined by a second straight edge 12a and a second semi-elliptically curved edge 12b.

The first and second pads 11 and 12 are placed so that first and second straight edges 11a and 12a face to each other but are distanced from each other. The first and second straight edges 11a and 12a extend parallel to each other. Namely, the first and second straight edges 11a and 12a extend in a first horizontal direction that is parallel to a surface of the board 10. The first and second pads 11 and 12 are distanced from each other in a second horizontal direction that is approximately perpendicular to the first horizontal direction. The first and second pads 11 and 12 have first and second semi-major axes that are aligned to each other and are parallel to the second horizontal direction. The first and second pads 11 and 12 also have first and second minor axes that parallel to each other and also parallel to the first horizontal direction.

The first and second wirings 13 and 14 extend on the first and second longitudinal center axes of the first and second pads 11 and 12. The first and second wirings 13 and 14 extend outwardly from the first and second semi-elliptically curved edges 11b and 12b. The first pad 11 has a first dimension that is defined by a maximum size thereof in the first horizontal direction. The first dimension corresponds to a first length of the first straight edge 11a. The second pad 12 has a second dimension that is defined by a maximum size thereof in the first horizontal direction. The second dimension corresponds to a second length of the second straight edge 12a. The second length of the second straight edge 12a can be equal to the first length of the first straight edge 11a.

The first pad 11 has a third dimension that is defined in the first semi-major axis that is parallel to the second horizontal direction. The third dimension corresponds to the length of the first semi-major axis. The length of the first semi-major axis corresponds to a distance between the first straight edge 11a and a point connecting between the first wiring 13 and the first semi-elliptically curved edge 11b. In other words, the third dimension is measured on the first semi-major axis.

The second pad 12 has a fourth dimension that is defined in the second semi-major axis that is parallel to the second horizontal direction. The fourth dimension corresponds to the length of the first semi-major axis. The length of the first semi-major axis corresponds to a distance between the second straight edge 12a and a point connecting between the second wiring 14 and the second semi-elliptically curved edge 12b. In other words, the fourth dimension is measured on the second semi-major axis.

In a case, the first, second, third and fourth dimensions of the first and second pads 11 and 12 may be, but is not limited to, 0.4 millimeters. A distance between the first and second pads 11 and 12 is defined by a distance between the first and second straight lines 11a and 12a. The distance between the first and second pads 11 and 12 may be, but is not limited to, 0.1 millimeter.

The first pad 11 has a first side portion 11c and a first center portion 11d. The first side portion 11c extends along and adjacent to the first semi-elliptically curved edge 11b. The first center portion 11d has a semi-elliptical shape. The first center portion 11d is partially surrounded by the first side portion 11c. The first center portion 11d is defined by the first side portion 11c and the first straight edge 11a. The first pad 11 has no physical boundary between the first side portion 11c and the first center portion 11d.

The second pad 12 has a second side portion 12c and a second center portion 12d. The second side portion 12c extends along and adjacent to the second semi-elliptically curved edge 12b. The second center portion 12d has a semi-elliptical shape. The second center portion 12d is partially surrounded by the second side portion 12c. The second center portion 12d is defined by the second side portion 12c and the second straight edge 12a. The second pad 12 has no physical boundary between the second side portion 12c and the second center portion 12d.

The solder mask 15 extends over the board 10, the first and second wirings 13 and 14, and the first and second side portions 11c and 12c of the first and second pads 11 and 12. The solder mask 15 has an opening 15a that has an elliptical shape in plan view. The opening 15a has a major axis that is aligned to the semi-major axes of the first and second pads 11 and 12. The major axis of the opening 15a is parallel to the second horizontal direction. The opening 15a has a first maximum dimension that is defined in the first horizontal direction. The first maximum dimension is defined in the minor axis of the opening 15a. The opening 15a has a second maximum dimension that is defined in the second horizontal direction. The second maximum dimension is defined in the major axis of the opening 15a. The first maximum dimension may typically be, but is not limited to, 0.3 millimeters. The second maximum dimension may typically be, but is not limited to, 0.8 millimeters.

The opening 15a extends over the first and second center portions 11d and 12d of the first and second pads 11 and 12 and a first intervening region 10a of the surface of the board 10. The first intervening region 10a is defined between the first and second straight edges 11a and 12a of the first and second pads 11 and 12. Namely, the first intervening region 10a of the surface of the board 10 is positioned between the first and second center portions 11d and 12d of the first and second pads 11 and 12. The opening 15a has a center that is positioned at a center of the first intervening region 10a.

The solder 16 is provided in the opening 15a so that the solder 16 extends over the first and second center portions 11d and 12d of the first and second pads 11 and 12 and the first intervening region 10a of the surface of the board 10. The solder 16 is electrically conductive. The first and second pads 11 and 12 are electrically connected to each other through the solder 16. In other words, the first and second pads 11 and 12 are bridge-connected to each other by the solder 16.

Figure 2A:
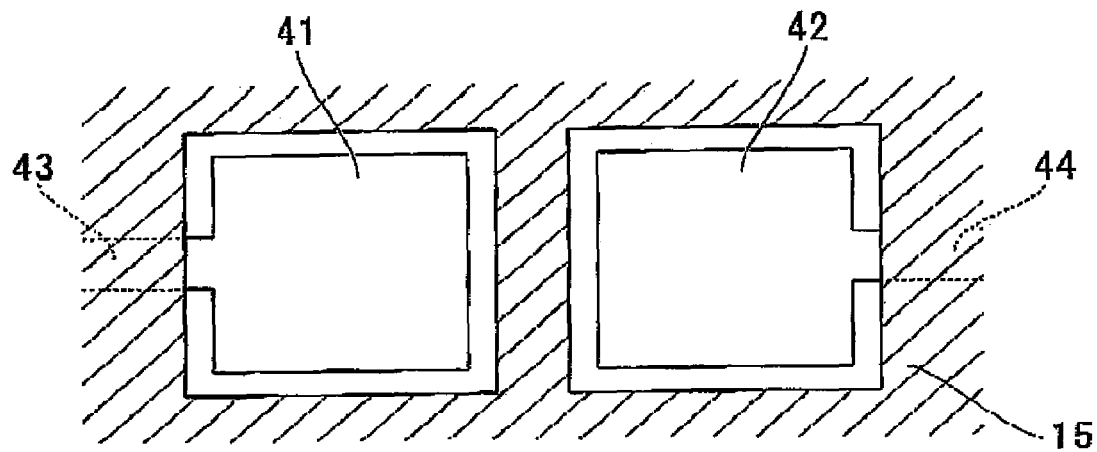
FIG. 2A is a fragmentary plan view illustrating mounting pads over the circuit board in accordance with the first embodiment of the present invention.
Figure 2B:
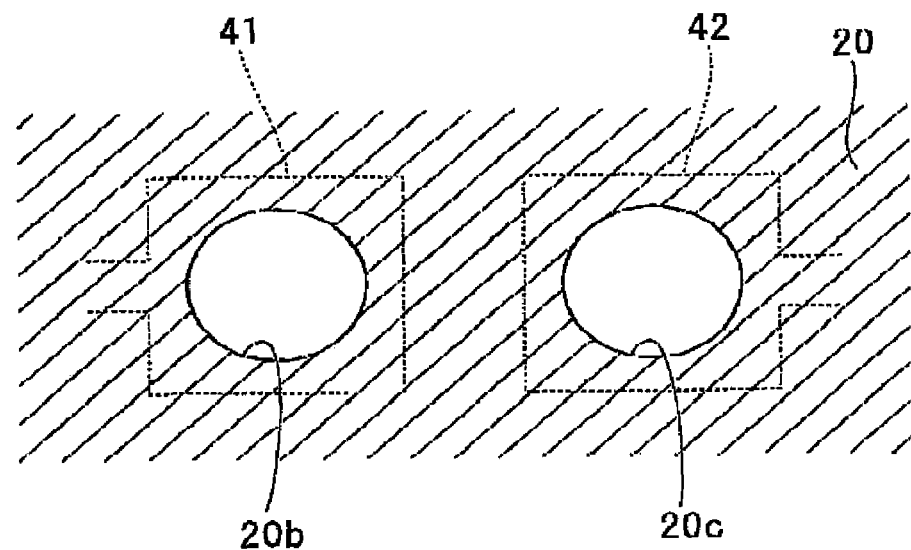
FIG. 2B is a plan view illustrating a mask stencil having holes being placed over the mounting pads of FIG. 2A in a step involved in a manufacturing method.

In addition, a mounting pad is provided on the surface of the board 10 so that elements such as resistive elements are mounted on the mounting pad. FIG. 2A is a fragmentary plan view illustrating mounting pads over the circuit board in accordance with the first embodiment of the present invention. FIG. 2B is a plan view illustrating a mask stencil having holes being placed over the mounting pads of FIG. 2A in a step involved in a manufacturing method.

As shown in FIG. 2A, first and second mounting pads 41 and 42 are provided on the surface of the board 10. The first and second mounting pads 41 and 42 are distanced from each other. Typical examples of the shapes of the first and second mounting pads 41 and 42 may include, but are not limited to, a rectangle, and a square. In case of the square shape, the first and second pads 41 and 42 have each side that may have, but is not limited to, approximately 0.4 millimeters in length. A distance between the first and second mounting pads 41 and 42 is defined between first and second confronting sides of the first and second mounting pads 41 and 42. A typical example of the distance between the first and second mounting pads 41 and 42 may be, but is not limited to, approximately 0.2 millimeters.

A third wiring 43 extends outwardly from a first opposite side to the first confronting side of the first mounting pad 41. A fourth wiring 44 extends outwardly from a second opposite side to the second confronting side of the second mounting pad 42. The first mounting pad 41 is electrically connected to the third wiring 43. The second mounting pad 42 is electrically connected to the fourth wiring 44. Each of the first and second mounting pads 43 and 44 and the third and fourth wirings 43 and 44 can be made of a conductive material such as a metal. Typical examples of the conductive material may include, but are not limited to, copper (Cu) and gold (Au). A copper plated layer or a gold plated layer can be used. An element is provided to be connected between the first and second mounting pads 41 and 42. The distance between the first and second mounting pads 41 and 42 can be set at 0.5 millimeters.

The solder mask 15 extends over the third and fourth wirings 43 and 44 and the first and second mounting pads 41 and 42. The element is provided to be connected between the first and second mounting pads 41 and 42. The element has first and second electrodes that are electrically connected to the first and second mounting pads 41 and 42, respectively.

In the manufacturing process, a metal mask stencil 20 is placed over the solder mask 15 and the first and second mounting pads 41 and 42. The metal mask stencil 20 has first and second holes 20b and 20c which are positioned over center portions of the first and second mounting pads 41 and 42. A typical example of the shape in plan view of the first and second holes 20b and 20c may be, but is not limited to, a circle with a diameter of approximately 0.3 millimeters.

The distance between the first and second pads 11 and 12 can preferably be narrower than the distance between the first and second mounting pads 41 and 42 so as to promote that a reflow-solder 16 having a surface tension bridges between the first and second pads 11 and 12 in a reflow process. The narrower distance between the first and second pads 11 and 12 needs a narrower mounting area than a mounting area needed for mounting the above-described zero-ohm resistance. Causing the solder 16 to bridge or electrically connect the first and second pads 11 and 12 provides or ensures a test point. The distance between the first and second pads 11 and 12 may typically be, but is not limited to, approximately 0.1 millimeter. As described above, the distance between the first and second mounting pads 41 and 42 may typically be, but is not limited to, approximately 0.2 millimeter.

The following two factors can eliminate the zero-ohm resistance. The first factor is that the distance between the first and second pads 11 and 12 is narrower than the distance between the first and second mounting pads 41 and 42. The second factor is that the solder 16 bridges between the first and second pads 11 and 12. No provision of the zero-ohm resistance reduces the number of the parts or elements that are mounted on the board 10. No provision of the zero-ohm resistance means that any process for mounting the zero-ohm resistance is not carried out. No provision of the zero-ohm resistance can reduce the defective rate due to no defects itself or of mounting the same. No provision of the zero-ohm resistance can reduce the cost of the circuit board and improves the yield thereof.

Figure 3:
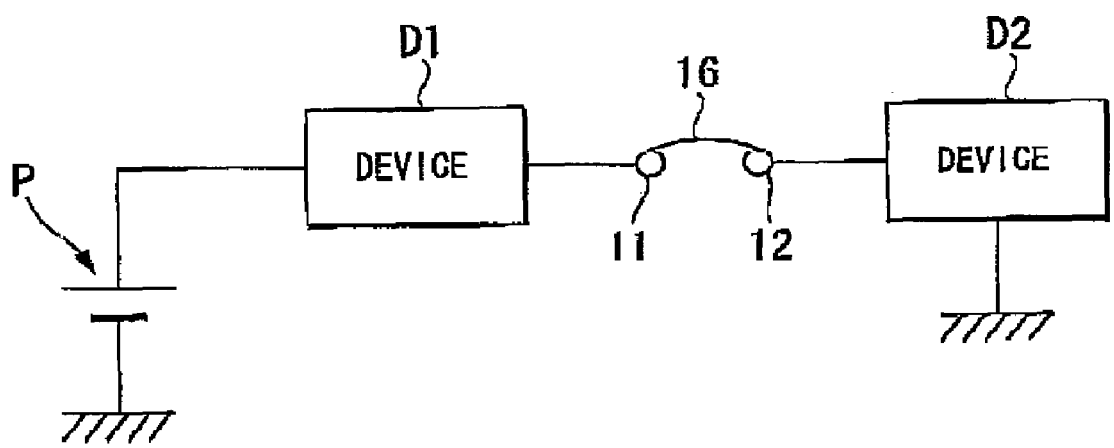
FIG. 3 is a diagram illustrating an equivalent circuit of the circuit board of FIG. 1.

After the solder 16 bridging the first and second pads 11 and 12 has been removed, then a pair of the first and second pads 11 and 12 can be used as the test point. FIG. 3 is a diagram illustrating an equivalent circuit of the circuit board of FIG. 1. First and second devices D1 and D2 are electrically connected in series to a power supply P. The first device D1 may, for example, be a voltage device that generates a predetermined voltage. The second device D2 may, for example, be a memory. The first device D1 is electrically connected between the power supply P and the first pad 11. The second device D2 is eclectically connected between the second pad 12 and the ground. The first and second pads 11 and 12 are connected to each other by the solder 16. After the solder 16 bridging the first and second pads 11 and 12 has been removed, then a pair of the first and second pads 11 and 12 can be used as the test point. For example, a first current flowing through the first pad 11 only can be measured, while a second current flowing through the second pad 12 only can be measured. This facilitates the accomplishment of the test of the circuit board.

Figure 4:
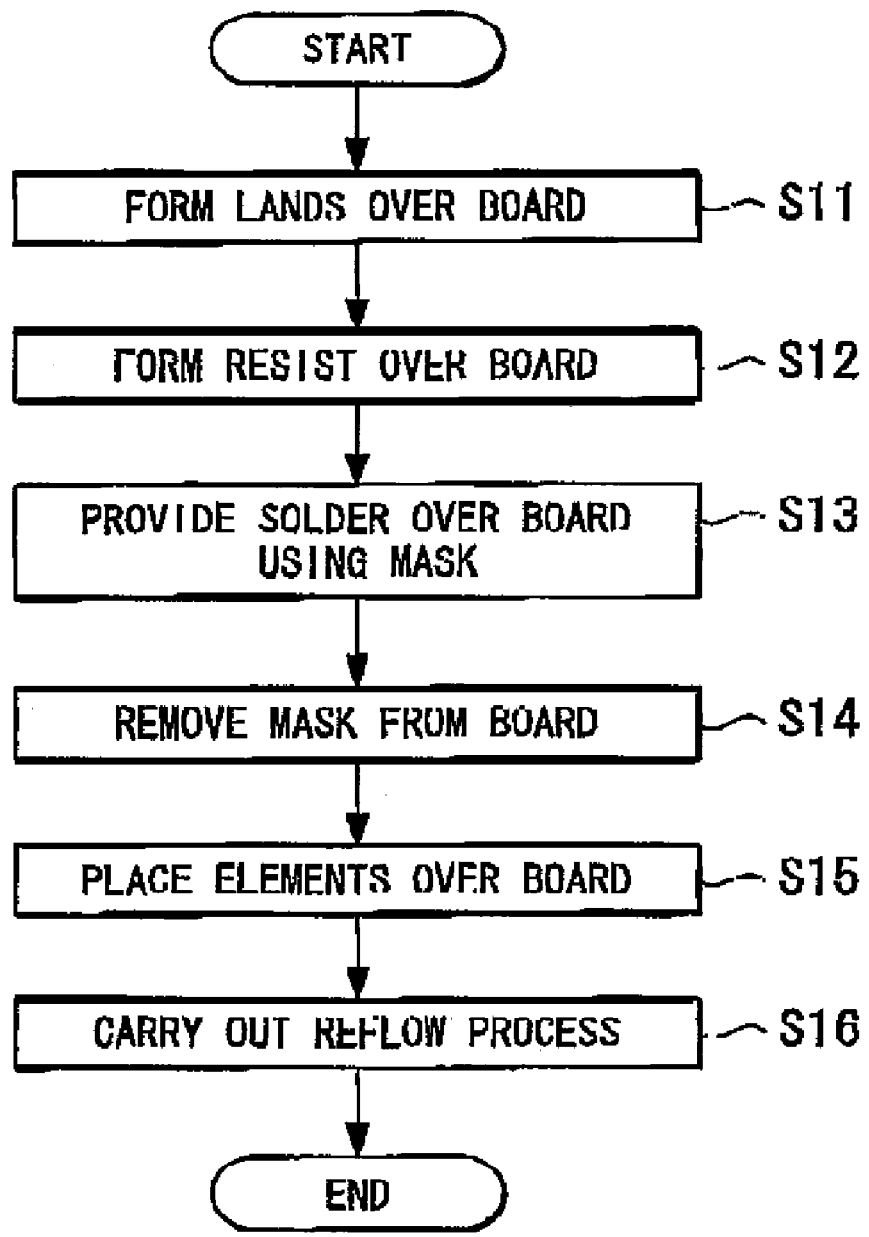
FIG. 4 is a flowchart illustrating sequential steps involved in a method of forming the circuit board of FIG. 1.

A method of forming the above-described circuit board will be described. FIG 4 is a flow chart illustrating sequential steps involved in a method of forming the circuit board of FIG. 1.

In Step S11, a board 10 is prepared. A metal layer is formed on a surface of the board 10. The metal layer may include, but is not limited to, a copper (Cu) plated layer or a gold (Au) plated layer A lithography process is carried out to pattern the metal layer, thereby forming, on the board 10, first and second pads 11 and 12 having predetermined patterns, first and second wirings 13 and 14, first and second mounting pads 41 and 42, and third and fourth wirings 43 and 44 as well as circuit patterns. The first and second wirings 13 and 14, first and second mounting pads 41 and 42, and third and fourth wirings 43 and 44 are illustrated in FIGS. 1A, 1B, 2A and 2B. The circuit patterns are not illustrated.

In Step S12, a solder mask 15 is formed which extends over the board 10 so that the solder mask 15 covers the first and second pads 11 and 12, the first and second wirings 13 and 14, the first and second mounting pads 41 and 42, and the third and fourth wirings 43 and 44 as well as the circuit patterns. An opening 15a and another opening 15e are formed in the solder mask 15. The opening 15a extends over the first and second center portions 11d and 12d of the first and second pads 11 and 12 and the first intervening region 10a between the first and second pads 11 and 12. The opening 15e extends over the first and second mounting pads 41 and 42 and a second intervening region of the surface of the board 10, wherein the second intervening region is positioned between the first and second mounting pads 41 and 42. As will be described in later, the opening 15a extending over the first and second pads 11 and 12 facilitates the solder 16 to bridge between the first and second pads 11 and 12. The opening 15a has the center that is positioned at the center of the first intervening region 10a. Namely, the center of the opening 15a is positioned at an intermediate position between the first and second pads 11 and 12.

In Step S13, a mask stencil is placed over the solder mask 15 to form solders 16 on selected regions over the board 10. The mask stencil may be a metal mask stencil. The metal mask stencil can be realized by a metal plate that has first, second and third predetermined patterns of opening 20a, 20b and 20c. The first, second and third predetermined patterns of opening 20a, 20b and 20c have predetermined shapes and predetermined dimensions. The mask stencil is aligned to the board 10 so that the first predetermined pattern of opening 20a is positioned over the first and second pads 11 and 12, while the second and third predetermined patterns of opening 20b and 20c are positioned over the first and second mounting pads 41 and 42, respectively. A solder cream is applied on an upper surface of the mask stencil 20. A squeegee is moved to slide along the upper surface of the mask stencil 20 to fill up the solder cream into the first, second and third predetermined patterns of opening 20a, 20b and 20c of the mask stencil 20. The mask stencil 20 is then removed from the board 10 so that predetermined patterns of solder cream are provided over the board 10.

Figure 5A:
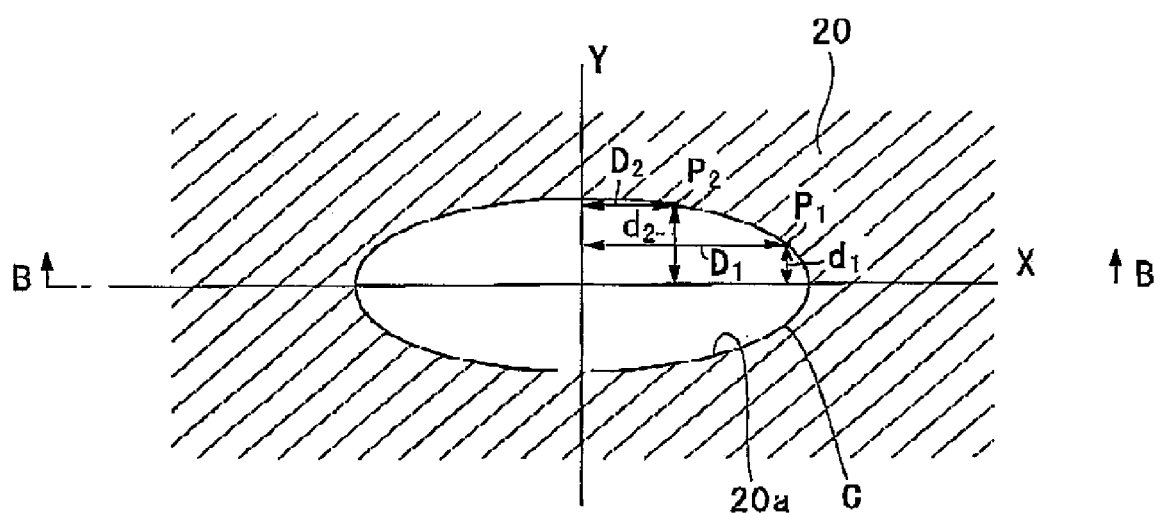
FIG. 5A is a fragmentary plan view illustrating a mask stencil having a first predetermined pattern of opening in accordance with the first embodiment of the present invention.
Figure 5B:
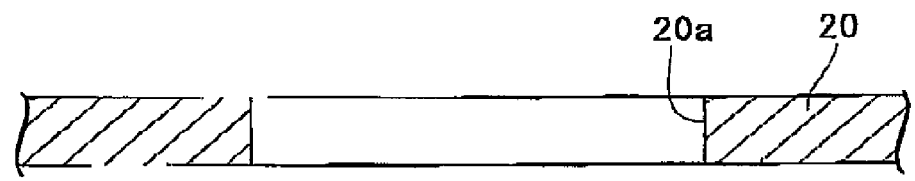
FIG. 5B is a fragmentary cross sectional elevation view, taken along a B-B line of FIG. 5A.

As described above, the mask stencil 20 has the first, second and third predetermined patterns of opening 20a, 20b and 20c at predetermined positions so that the first predetermined pattern of opening 20a is positioned over the first and second pads 11 and 12, while the second and third predetermined patterns of opening 20b and 20c are positioned over the first and second mounting pads 41 and 42, respectively. FIG. 5A is a fragmentary plan view illustrating a mask stencil having a first predetermined pattern of opening in accordance with the first embodiment of the present invention. FIG. 5B is a fragmentary cross sectional elevation view, taken along a B-B line of FIG. 5A. The mask stencil 20 has a first predetermined pattern of opening 20a that may have a first center axis "X" and a second center axis "Y" that is perpendicular to the first center axis "X". The first predetermined pattern of opening 20a may have a circumference "C" being defined by a locus of points "P" having a distance "D" from the second center axis "Y" and a distance "d" from the first center axis "X". The distance "D" is defined in parallel to the first center axis "X". The distance "d" is defined in parallel to the second center axis. The distance "D" simply decreases while the distance "d" simply increases. The distance "D" simply increases while the distance "d" simply decreases.

For example, a point "P1" on the circumference "C" has a distance "D1" from the second center axis "Y" and a distance "d1" from the first center axis "X". Another point "P2" on the circumference "C" has a distance "D2" from the second center axis "Y" and a distance "d2" from the first center axis "X". The distance "D1" is larger than the distance "D2". The distance "d1" is smaller than the distance "d2". When the point "P" on the circumference "C" is moved from the point "P1" to the point "P2", the distance "D" from the second center axis "Y" decreases from the distance D1 to the distance D2, while the distance "d" from the first center axis "X" increases from the distance "d1" to the distance "d2".

Preferably, the first and second center axes "X" and "Y" cross to each other at a center position that is positioned in the intervening region between the first and second pads 11 and 12, and the first intervening region 10a between the first and second pads 11 and 12.

Typically, the circumference "C" of the first predetermined pattern of opening 20a may have a circular shape or an elliptical shape in plan view.

The first predetermined pattern of opening 20a extends over the first and second center portions 11d and 12d of the first and second pads 11 and 12 and the first intervening region 10a of the surface of the board 10. The mask stencil 20 also has a second predetermined pattern of opening 20b that has a circular shape in plan view. The second predetermined pattern of opening 20b extends over a center portion of the first mounting pad 41. The mask stencil 20 also has a third predetermined pattern of opening 20c that has a circular shape in plan view. The third predetermined pattern of opening 20c extends over a center portion of the second mounting pad 42.

The first predetermined pattern of opening 20a is positioned over the solder mask 15 that covers the first and second pads 11 and 12 and the surface of the board 10. While the mask stencil 20 is positioned over the board 10, the center of the first predetermined pattern of opening 20a is aligned in plan view to the center of the first intervening region 10a that is positioned between the first and second pads 11 and 12. The first predetermined pattern of opening 20a extends over a predetermined region of the solder mask 15, the predetermined region of the solder mask 15 being positioned just over the first and second center portions 11d and 12d of the first and second pads 11 and 12 and over the intervening region 10a between the first and second center portions 11d and 12d. The first predetermined pattern of opening 20a has an elliptical shape that is similar to the elliptical shape of the combined first and second pads 11 and 12.

Figure 6:
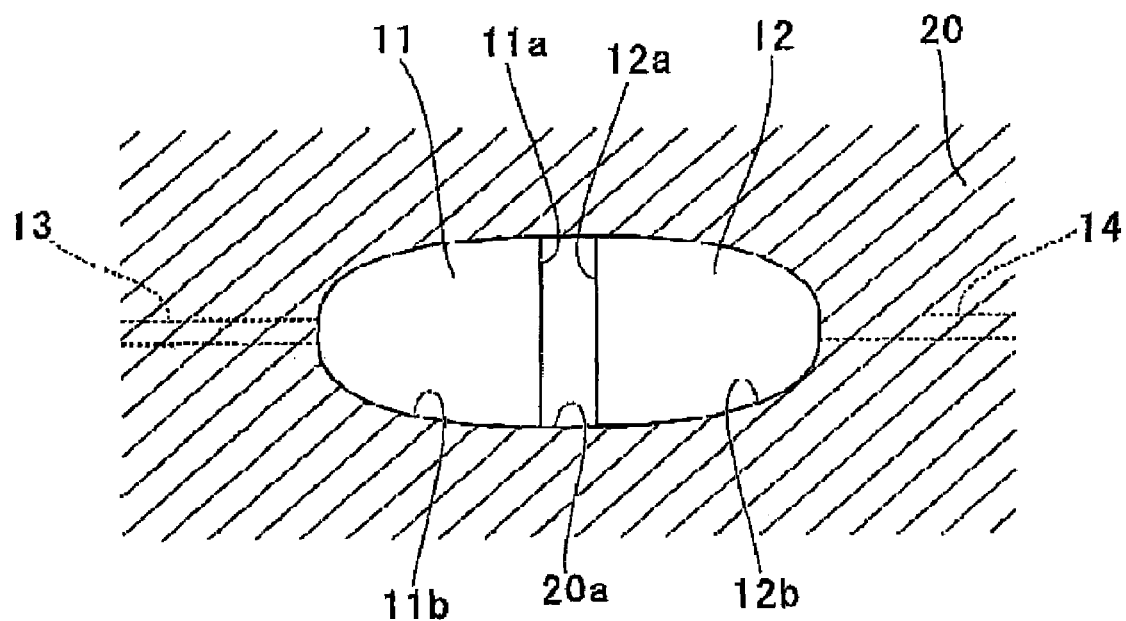
FIG. 6 is a fragmentary plan view illustrating a mask stencil that is positioned over a board in accordance with the first embodiment of the present invention.

FIG. 6 is a fragmentary plan view illustrating a mask stencil that is positioned over a board in accordance with the first embodiment of the present invention. As shown in FIG. 6, the mask stencil 15 is positioned or aligned relative to the board 10 so that an elliptical edge of the first predetermined pattern of opening 20a of the mask stencil 20 is aligned in plan view to a set of the first and second semi-elliptically curved edges 11b and 12b of the first and second pads 11 and 12 The first predetermined pattern of opening 20a of the mask stencil 20 has a first maximum dimension of 0.4 millimeters that is defined in the first horizontal direction and a second maximum dimension of 0.9 millimeters that is defined in the second horizontal direction. The first predetermined pattern of opening 20a of the mask stencil 20 has a larger area than an area of the opening 15a of the solder mask 15.

The larger area of the first predetermined pattern of opening 20a can ensure a larger amount of the solder cream. The amount of the solder cream to be provided on the board 10 depends on the area of the first predetermined pattern of opening 20a and the thickness of the mask stencil 20. In general, the mask stencil 20 has a fixed thickness. The amount of the solder cream can be changed by changing the area of the first predetermined pattern of opening 20a of the mask stencil 20. In a case, the opening 15a of the solder mask 15 can have an area of approximately 0.18 mm$^2$, while the first predetermined pattern of opening 20a of the mask stencil 20 can have an area of approximately 0.27 mm². The mask stencil 20 can have a thickness of approximately 0.12 millimeters. The amount of the solder cream that fills up the first predetermined pattern of opening 20a of the mask stencil 20 can be approximately 0.0324 mm³.

As shown in FIG. 5B, the first predetermined pattern of opening 20a has a circumference that has a thickness that is greater than the distance between the first and second pads 11 and 12. As described above, the amount of the solder cream that fills up the first predetermined pattern of opening 20a depends on the area of the first predetermined pattern of opening 20a and the thickness of the mask stencil 20. Increasing the thickness of the mask stencil 20 allows reducing the area of the first predetermined pattern of opening 20a, in order to ensure a fixed amount of the solder cream that fills up the first predetermined pattern of opening 20a of the mask stencil 20. Excess reduction in the area of the first predetermined pattern of opening 20a can cause that the solder cream is fixedly engaged with the first predetermined pattern of opening 20a, and the solder cream is removed together with the mask stencil 20 without the solder cream leaving over the board 10. In order to ensure that the mask stencil 20 is removed while leaving the solder cream over the board 10, it can be effective that the thickness of the circumference of the first predetermined pattern of opening 20a is larger than the first and second pads 11 and 12.

Increase the surface tension of the solder makes it difficult to fill up the opening of the mask stencil without over-coating the mask stencil. Reducing the thickness of the mask stencil makes it difficult to fill up the opening of the mask stencil without over-coating the mask stencil. In order to facilitate that the solder fills up the first predetermined pattern of opening 20a of the mask stencil 20, it can be effective that the thickness of the circumference of the first predetermined pattern of opening 20a is larger than the first and second pads 11 and 12. In order to reduce the weight of the mask stencil 20, the mask stencil 20 can be modified to reduce a thickness of the mask stencil 20 except for a portion adjacent to the circumference of the first predetermined pattern of opening 20a. Namely, the thickness of the circumference of the first predetermined pattern of opening 20a is larger than an average of the thickness of the mask stencil 20.

The mask stencil 20 is used to selectively apply the solder cream over the first and second center portions 11d and 12d of the first and second pads 11 and 12 and the first intervening region 11a of the surface of the board 10. The distance between the first and second mounting pads 41 and 42 is approximately 0.2 millimeters. Reducing the thickness of the mask stencil 20 increases the necessary area of the first predetermined pattern of opening 20a, thereby, ensuring the necessary amount of solder for connecting an element to the board. Increasing the area necessary area of the first predetermined pattern of opening 20a can cause any unintended short circuit between the pads.

The mask stencil 20 has the first, second and third predetermined patterns of opening 20a, 20b and 20c. The first predetermined pattern of opening 20a extends over the first and second center portions 11d and 12d of the first and second pads 11 and 12 and also over the first intervening region 10a of the surface of the board 10. The first intervening region 10a is positioned between the first and second pads 11 and 12. The second and third predetermined patterns of opening 20b and 20c extend over the first and second mounting pads 41 and 42, respectively. The second intervening region of the surface of the board 10 is positioned between the first and second mounting pads 41 and 42.

The mask stencil 20 is positioned relative to the board 10. The solder cream is applied over the mask stencil 20. The squeegee is moved to slide along the upper surface of the mask stencil to fill up the solder cream into the first predetermined pattern of opening 20a of the mask stencil 20 and the second and third predetermined patterns of opening 20b and 20c thereof. As a result, a first portion of the solder cream extends over the first and second center portions 11d and 12d of the first and second pads 11 and 12 and the first intervening region 10a of the surface of the board 10. As shown in FIG. 2B, second and third portions of the solder cream extend over center regions of the first and second mounting pads 41 and 42, respectively. A typical example of the shape of the second and third predetermined patterns of opening 20b and 20c of the mask stencil 20 can be, but is not limited to, a circle. A diameter of the circle of the second and third predetermined patterns of opening 20b and 20c can preferably be smaller than the length of every side of the squired mounting pads 41 and 42. A typical example of the diameter of the circle can be, but is not limited to, approximately 0.3 millimeters.

With reference back to FIG. 4, in Step S13, the solders are selectively provided by using the mask stencil 20. A first piece of solder is placed over the first and second center portions 11d and 12d of the first and second pads 11 and 12 and the first intervening region 10a of the surface of the board 10. A second piece of solder is placed over the second mounting pad 41. A third piece of solder is placed over the third mounting pad 42.

In Step S14, after the placements of the first, second and third pieces of solder have been completed, and then the mask stencil 20 is removed from the board 10.

In Step S15, a predetermined set of elements are placed over the board 10. The predetermined set of elements may include, but is not limited to, one or more resistive elements. In a typical case, a resistive element can be placed between the first and second mounting pads 41 and 42. Placements of the predetermined set of elements can be carried out using a mounter. The element is placed over the board 10 while the solder is crushed by the placed element.

In Step S16, after the placements of the elements have been completed, then a reflow process will be carried out. Typical examples of the reflow process may be, but are not limited to, an infrared reflow process using an infrared ray and a hot air reflow. The reflow process causes simultaneously both the bridge connection between the first and second pads 11 and 12 and the connection between the element and each of the first and second mounting pads 41 and 42.

In accordance with the first embodiment, the distance between the first and second pads 11 and 12 is narrow and may be, but is not limited to, approximately 0.1 millimeter. The conductive material electrically connects the first and second pads 11 and 12. In other words, the conductive material provides an electrical bridge between the first and second pads 11 and 12. The conductive material may be realized by, but is not limited to, a solder 16. The conductive material extends within the opening 15a of the solder mask 15. The conductive material such as the solder 16 extends over the first and second center portions 11d and 12d of the first and second pads 11 and 12, and also over the first intervening region 10a of the surface of the board 10. The provision of the conductive material allows no provision of any zero-ohm resistance. The above-described structure can reduce the number of the parts or elements that are mounted on the board 10. No provision of the zero-ohm resistance means that any process for mounting the zero-ohm resistance is not carried out. No provision of the zero-ohm resistance can reduce the defective rate due to no defects itself or of mounting the same.

No provision of the zero-ohm resistance can reduce the cost of the circuit board. No provision of the zero-ohm resistance can improve the yield of the circuit board. It was conformed that the solder 16 has the reliable electrical connection between the first and second pads 11 and 12.

After the solder 16 has been removed from the board 10, the first and second pads 11 and 12 can be used as a test point, thereby facilitating the accomplishment of the test of the circuit board.

The conductive material such as the solder 16 can be selectively provided simply using the mask stencil 20 such as the metal mask stencil in order to provide a bridge connection between the first and second pads 11 and 12. Advantageously, a modified mask stencil can be used to selectively and simultaneously provide both the conductive material such as the solder 16 and another conductive material such as another solder that electrically connects other elements over the board 10.

The above described first embodiment can of course be modified. The first and second pads 11 and 12 can be modified in dimension and shape. The opening 15a of the solder mask 15 can also be modified in dimension and shape. The shape of the opening 15a is defined by the shape of the opening 20a of the mask stencil 20. The shape of the opening 15a can be either similar to or different from the external peripheral shape of the set of the first and second pads.

As described above, the first and second straight edges 11a and 12a can advantageously extend in the first horizontal direction that is perpendicular to the second horizontal direction along which the first and second wirings 13 and 14 extend outwardly from the first and second pads 11 and 12. The first and second pads 11 and 12 can advantageously be modified so that the first and second straight lines 11a and 12a extend in a different horizontal direction from the first and second horizontal directions.

The distance between the first and second pads 11 and 12, for example, the distance between the first and second straight edges 11a and 12a can advantageously be, but is not limited to, approximately 0.1 millimeter. The distance between the first and second pads 11 and 12 can advantageously be adapted as long as the distance between the first and second pads 11 and 12 is smaller than the distance between the first and second mounting pads 41 and 42. For example, if the distance between the first and second mounting pads is 0.3 millimeters, then the distance between the first and second pads 11 and 12 can advantageously be less than 0.3 millimeters, for example, 0.2 millimeters or 0.1 millimeter. An excess reduction of the distance between the first and second pads 11 and 12 can disturb the operation of the test. A typical example of the minimum distance may be, but is not limited to, approximately 0.1 millimeter.

Second Embodiment

Figure 7A:
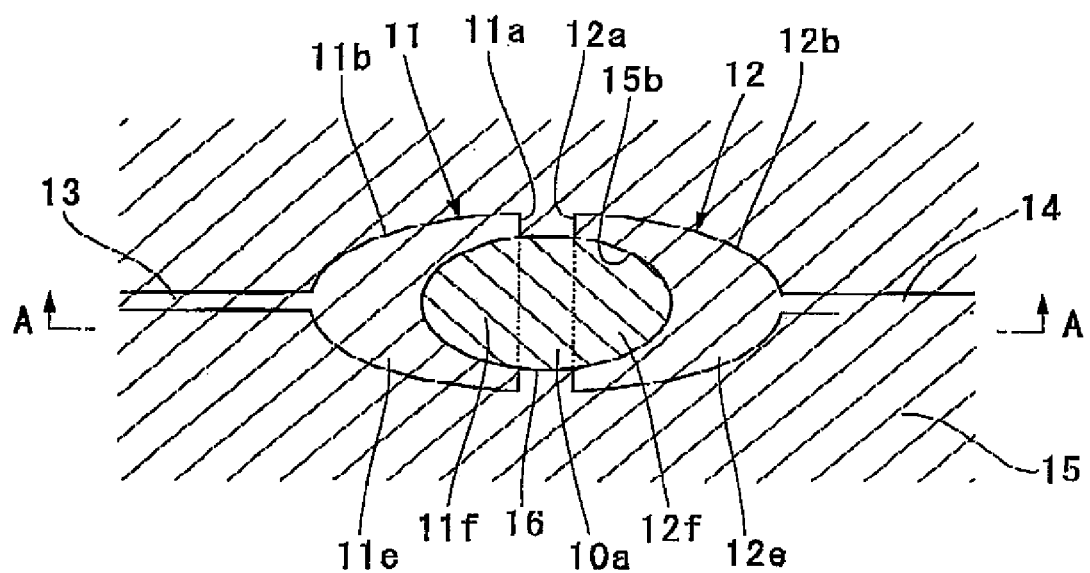
FIG. 7A is a fragmentary perspective plan view illustrating a circuit board including a pad structure in accordance with a second embodiment of the present invention.
Figure 7B:
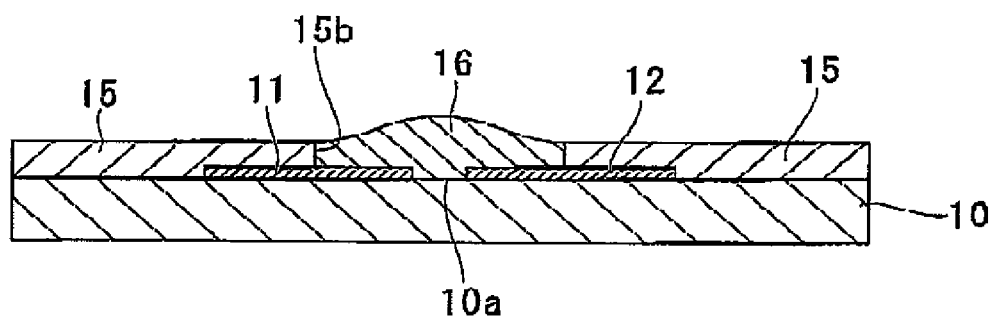
FIG. 7B is a fragmentary cross sectional elevation view, taken along an A-A line of FIG. 7A.

FIG. 7A is a fragmentary perspective plan view illustrating a circuit board including a pad structure in accordance with a second embodiment of the present invention. FIG. 7B is a fragmentary cross sectional elevation view, taken along an A-A line of FIG. 7A. The same reference numbers are allocated to the same elements between the first and second embodiments shown in FIGS. 1A, 1B, 7A and 7B. The following descriptions will focus on substantive differences of the second embodiment from the first embodiment. The solder mask 15 shown in FIG. 7A has an opening 15b that has an elliptical shape that is different from the elliptical shape of the opening 15a of the solder mask 15 shown in FIG. 1A. The opening 15b shown in FIG. 7A has the same ratio in length of the major axis to the minor axis as the opening 15a shown in FIG. 1A. In order words, the elliptical shape of the opening 15b shown in FIG. 7A is closer to the circle as compared to the elliptical shape of the opening 15a shown in FIG. 1A. The solder 16 is selectively placed in the opening 15b of the solder mask 15. The solder 16 provides an electrical bridge connection between the first and second pads 11 and 12.

The opening 15b has a first maximum dimension that is defined in the first horizontal direction. The first maximum dimension is defined in the minor axis of the opening 15b. The opening 15b has a second maximum dimension that is defined in the second horizontal direction. The second maximum dimension is defined in the major axis of the opening 15b. The first maximum dimension may typically be, but is not limited to, 0.3 millimeters. The second maximum dimension may typically be, but is not limited to, 0.5 millimeters.

The first and second pads 11 and 12 have first and second center portions 11f and 12f and first and second side portions 11e and 12e, respectively. The first and second center portions 11f and 12f of the first and second pads 11 and 12 shown in FIG. 7A have a smaller area than that of the first and second center portions 11d and 12d of the first and second pads 11 and 12 shown in FIG. 1A. The first and second side portions 11e and 12c of the first and second pads 11 and 12 shown in FIG. 7A have a larger area than that of the first and second side portions 11c and 12c of the first and second pads 11 and 12 shown in FIG. 1A. The first and second side portions 11e and 12e are covered by the solder mask 15. The first and second side portions 11f and 12f are in contact with the solder 16. The first and second pads 11 and 12 shown in FIG. 7A have a smaller contact area with the solder 16 than that of the first and second pads 11 and 12 shown in FIG. 1A.

As described above, the opening 15b shown in FIG. 7A has the same ratio in length of the major axis to the minor axis as the opening 15a shown in FIG. 1A. The reduction of the ratio in length of the major axis to the minor axis can preferably be made taking into account a surface tension of the solder 16 in the reflow process for electrically connecting the first and second pads 11 and 12. In the reflow process, the solder 16 is liquefied. The surface tension of the liquefied solder 16 causes a concentration of the liquefied solder 16 at a center of the opening 15b. The center of the opening 15b is positioned in the first intervening region 10a of the surface of the board 10. The surface of the board 10 is poor applicability of the liquefied solder 16 as compared to the surface of the first and second pads 11 and 12. The poor applicability of the first intervening region 10a can facilitate that the liquefied solder 16 expands between the first and second center portions 11f and 12f of the first and second pads 11 and 12. In view of facilitating that the reflow solder 16 expands to fill up the opening 15b of the solder mask 15, it is preferable that the opening 15b has a circle shape in plan view. The circle shape of the opening 15b reduces the contact area of the first and second pads 11 and 12, namely the area of the first and second center portions 11f and 12f of the first and second pads 11 and 12. In view of both ensuring a large contact area of the first and second pads 11 and 12 and facilitating the reflow solder 16 to fill up the opening 15b, the elliptical shape of the opening 15b can be better.

The first and second pads 11 and 12 shown in FIG. 7A can be formed in the same set of processes as those described above in the first embodiment of the present invention. The solder cream can be selectively placed by using the mask stencil that is similar to the mask stencil 20 shown in FIGS. 5A and 5B.

In accordance with the second embodiment, the distance between the first and second pads 11 and 12 is narrow and may be, but is not limited to, approximately 0.1 millimeter. The conductive material electrically connects the first and second pads 11 and 12. In other words, the conductive material provides an electrical bridge between the first and second pads 11 and 12. The conductive material may be realized by, but is not limited to, a solder 16. The conductive material extends within the opening 15a of the solder mask 15. The conductive material such as the solder 16 extends over the first and second center portions 11d and 12d of the first and second pads 11 and 12, and also over the first intervening region 10a of the surface of the board 10. The provision of the conductive material allows no provision of any zero-ohm resistance. The above-described structure can reduce the number of the parts or elements that are mounted on the board 10. No provision of the zero-ohm resistance means that any process for mounting the zero-ohm resistance is not carried out. No provision of the zero-ohm resistance can reduce the defective rate due to no defects itself or of mounting the same. No provision of the zero-ohm resistance can reduce the cost of the circuit board. No provision of the zero-ohm resistance can improve the yield of the circuit board.

After the solder 16 has been removed from the board 10, the first and second pads 11 and 12 can be used as a test point, thereby facilitating the accomplishment of the test of the circuit board.

The conductive material such as the solder 16 can be selectively provided simply using the mask stencil 20 such as the metal mask stencil in order to provide a bridge connection between the first and second pads 11 and 12. Advantageously, a modified mask stencil can be used to selectively and simultaneously provide both the conductive material such as the solder 16 and another conductive material such as another solder that electrically connects other elements over the board 10.

The above described first embodiment can of course be modified. The first and second pads 11 and 12 can be modified in dimension and shape. The opening 15a of the solder mask 15 can also be modified in dimension and shape. The shape of the opening 15a is defined by the shape of the opening 20a of the mask stencil 20. The shape of the opening 15a can be either similar to or different from the external peripheral shape of the set of the first and second pads.

As described above, the first and second straight edges 11a and 12a can advantageously extend in the first horizontal direction that is perpendicular to the second horizontal direction along which the first and second wirings 13 and 14 extend outwardly from the first and second pads 11 and 12. The first and second pads 11 and 12 can advantageously be modified so that the first and second straight lines 11a and 12a extend in a different horizontal direction from the first and second horizontal directions.

The distance between the first and second pads 11 and 12, for example, the distance between the first and second straight edges 11a and 12a can advantageously be, but is not limited to, approximately 0.1 millimeter. The distance between the first and second pads 11 and 12 can advantageously be adapted as long as the distance between the first and second pads 11 and 12 is smaller than the distance between the first and second mounting pads 41 and 42. For example, if the distance between the first and second mounting pads is 0.3 millimeters, then the distance between the first and second pads 11 and 12 can advantageously be less than 0.3 millimeters, for example, 0.2 millimeters or 0.1 millimeter. An excess reduction of the distance between the first and second pads 11 and 12 can disturb the operation of the test. A typical example of the minimum distance may be, but is not limited to, approximately 0.1 millimeter.

Third Embodiment

Figure 8A:
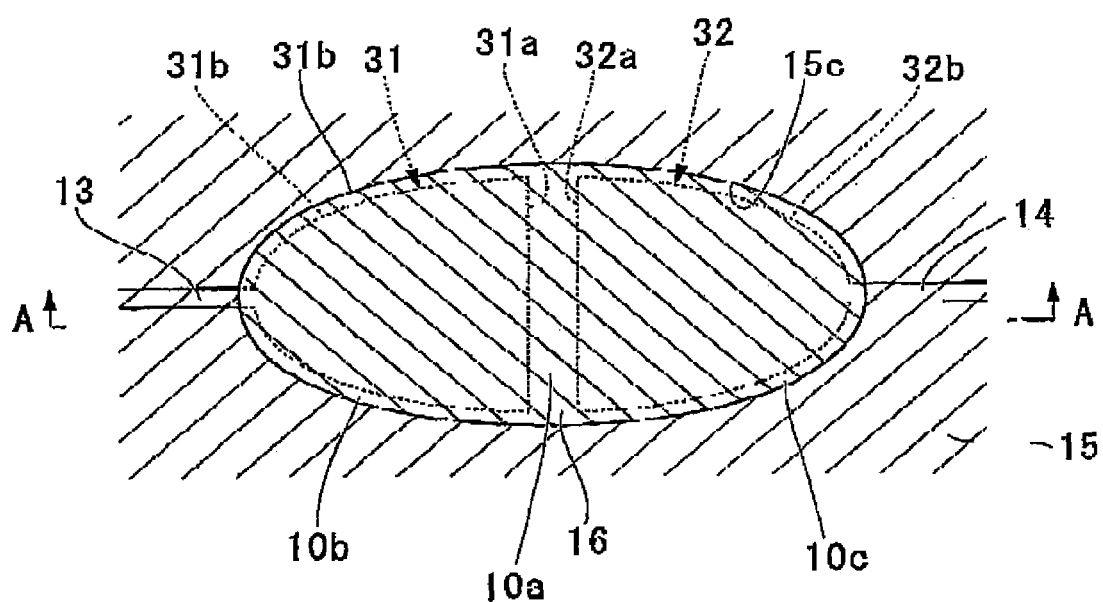
FIG. 8A is a fragmentary perspective plan view illustrating a circuit board including a pad structure in accordance with a third embodiment of the present invention.
Figure 8B:
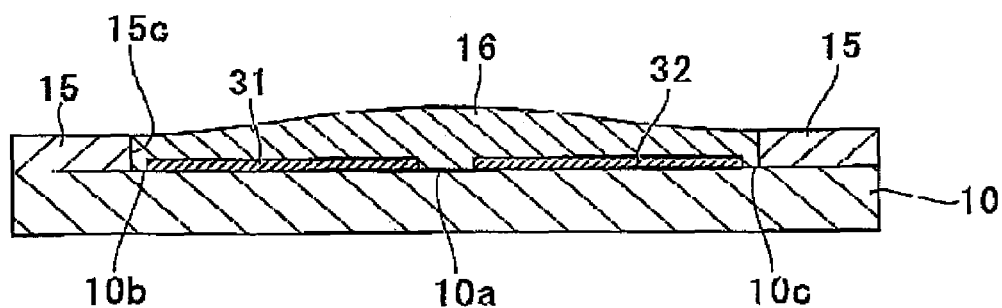
FIG. 8B is a fragmentary cross sectional elevation view, taken along an A-A line of FIG. 8A.

FIG. 8A is a fragmentary perspective plan view illustrating a circuit board including a pad structure in accordance with a third embodiment of the present invention. FIG. 8B is a fragmentary cross sectional elevation view, taken along an A-A line of FIG. 8A. The same reference numbers are allocated to the same elements among the first, second and third embodiments shown in FIGS. 1A, 1B, 7A, 7B, 8A and 8B. The following descriptions will focus on substantive differences of the third embodiment from the first and second embodiments. The circuit board shown in FIGS. 8A and 8B has first and second pads 31 and 32, each of which has a semi-elliptical shape. The first pad 31 is defined by a first straight edge 31a and a first semi-elliptically curved edge 31b. The second pad 32 is defined by a second straight edge 32a and a second semi-elliptically curved edge 32b.

The first and second pads 31 and 32 are distanced from each other. The surface of the board 10 has a first intervening region 10a that is defined between the first and second edges 31a and 32a of the first and second pads 31 and 32.

The circuit board shown in FIGS. 8A and 8B has a solder mask 15 that has an opening 15c. The opening 15c has an elliptical shape in plan view. The opening 15c is larger in size than a set of the first and second pads 31 and 32. The opening 15c has an elliptically-curved edge that extends outside the first and second semi-elliptically curved edges 31b and 32b of The first and second pads 31 and 32. Namely, the pair of the first and second pads 31 and 32 is encompassed by the elliptically-curved edge of the opening 15c. The elliptically-curved edge of the opening 15c is distanced by second and third intervening regions 10b and 10c of the surface of the board 10 from the first and second semi-elliptically curved edges 31b and 32b of the first and second pads 31 and 32. Namely, the second intervening region 10b is a semi-elliptically curved stripe region that extends between a first half of the elliptically-curved edge of the opening 15c and the first semi-ellipticaly curved edge 31b of the first pad 31. The third intervening region 10c is a semi-elliptically curved stripe region that extends between a second half of the elliptically-curved edge of the opening 15c and the second semi-elliptically curved edge 32b of the second pad 31.

The first and second pads 31 and 32 are placed so that the first and second straight edges 31a and 32a face to each other but are distanced from each other. The first and second straight edges 31a and 32a extend parallel to each other. Namely, the first and second straight edges 31a and 32a extend in a first horizontal direction that is parallel to a surface of the board 10. The first and second pads 31 and 32 are distanced from each other in a second horizontal direction that is approximately perpendicular to the first horizontal direction. The first and second pads 31 and 32 have first and second semi-major axes that are aligned to each other and are parallel to the second horizontal direction. The first and second pads 31 and 32 also have first and second minor axes that parallel to each other and also parallel to the first horizontal direction.

The first and second wirings 13 and 14 extend on the first and second semi-major axes of the first and second pads 31 and 32. The first and second wirings 13 and 14 extend outwardly from the first and second semi-elliptically curved edges 31b and 32b. The first pad 31 has a first dimension that is defined by a maximum size thereof in the first horizontal direction. The first dimension corresponds to a first length of the first straight edge 31a. The second pad 32 has a second dimension that is defined by a maximum size thereof in the first horizontal direction. The second dimension corresponds to a second length of the second straight edge 32a. The second length of the second straight edge 32a can be equal to the first length of the first straight edge 31a.

The first pad 31 has a third dimension that is defined in the first semi-major axis that is parallel to the second horizontal direction. The third dimension corresponds to the length of the first semi-major axis. The length of the first semi-major axis corresponds to a distance between the first straight edge 31a and a point connecting between the first wiring 13 and the first semi-elliptically curved edge 31b. In other words, the third dimension is measured on the first semi-major axis.

The second pad 32 has a fourth dimension that is defined in the second semi-major axis that is parallel to the second horizontal direction. The fourth dimension corresponds to the length of the first semi-major axis. The length of the first semi-major axis corresponds to a distance between the second straight edge 32a and a point connecting between the second wiring 14 and the second semi-elliptically curved edge 32b. In other words, the fourth dimension is measured on the second semi-major axis.

In a case, the first, second, third and fourth dimensions of the first and second pads 31 and 32 may be, but is not limited to, 0.5 millimeters. A distance between the first and second pads 31 and 32 is defined by a distance between the first and second straight lines 31a and 32a. The distance between the first and second pads 31 and 32 may be, but is not limited to, 0.1 millimeter.

The solder mask 15 has the opening 15a that has the elliptical shape in plan view. The opening 15a has a major axis that is aligned to the semi-major axes of the first and second pads 31 and 32. The major axis of the opening 15a is parallel to the second horizontal direction. The opening 15a has a first maximum dimension that is defined in the first horizontal direction. The first maximum dimension is defined in the minor axis of the opening 15a. The opening 15a has a second maximum dimension that is defined in the second horizontal direction. The second maximum dimension is defined in the major axis of the opening 15a. The first maximum dimension may typically be, but is not limited to, approximately 0.5 millimeters. The second maximum dimension may typically be, but is not limited to, approximately 1.2 millimeters. The entireties of the first and second pads 31 and 32 are exposed through the opening 15c of the solder mask 15. The opening 15c is larger than the pair of the first and second pads 31 and 32 in order to ensure the maximum contact area of the first and second pads 31 and 32 with the solder 16.

The first and second pads 31 and 32 can be formed in the same manner as described in the first embodiment of the present invention. The mask stencil such as a metal mask stencil that has an elliptically shaped opening can be used to selectively apply or place the solder cream on the board 10. The dimensions of the elliptically shaped opening of the mask stencil can be determined based on the dimensions of the first and second pads 31 and 32.

In accordance with the third embodiment, the distance between the first and second pads 31 and 32 is narrow and may be, but is not limited to, approximately 0.1 millimeter. The conductive material electrically connects the first and second pads 31 and 32. In other words, the conductive material provides an electrical bridge between the first and second pads 31 and 32. The conductive material may be realized by, but is not limited to, a solder 16. The conductive material extends within the opening 15a of the solder mask 15. The conductive material such as the solder 16 extends over the first and second pads 31 and 32, and also over the first intervening region 10a of the surface of the board 10. The provision of the conductive material allows no provision of any zero-ohm resistance. The above-described structure can reduce the number of the parts or elements that are mounted on the board 10. No provision of the zero-ohm resistance means that any process for mounting the zero-ohm resistance is not carried out. No provision of the zero-ohm resistance can reduce the defective rate due to no defects itself or of mounting the same. No provision of the zero-ohm resistance can reduce the cost of the circuit board. No provision of the zero-ohm resistance can improve the yield of the circuit board.

After the solder 16 has been removed from the board 10, the first and second pads 31 and 32 can be used as a test point, thereby facilitating the accomplishment of the test of the circuit board.

The conductive material such as the solder 16 can be selectively provided simply using the mask stencil 20 such as the metal mask stencil in order to provide a bridge connection between the first and second pads 31 and 32. Advantageously, a modified mask stencil can be used to selectively and simultaneously provide both the conductive material such as the solder 16 and another conductive material such as another solder that electrically connects other elements over the board 10.

The above described first embodiment can of course be modified. The first and second pads 31 and 32 can be modified in dimension and shape. The opening 15a of the solder mask 15 can also be modified in dimension and shape. The shape of the opening 15a is defined by the shape of the opening 20a of the mask stencil 20. The shape of the opening 15a can be either similar to or different from the external peripheral shape of the set of the first and second pads.

As described above, the first and second straight edges 31a and 32a can advantageously extend in the first horizontal direction that is perpendicular to the second horizontal direction along which the first and second wirings 13 and 14 extend outwardly from the first and second pads 31 and 32. The first and second pads 31 and 32 can advantageously be modified so that the first and second straight lines 31a and 32a extend in a different horizontal direction from the first and second horizontal directions.

The distance between the first and second pads 31 and 32, for example, the distance between the first and second straight edges 31a and 32a can advantageously be, but is not limited to, approximately 0.1 millimeter. The distance between the first and second pads 31 and 32 can advantageously be adapted as long as the distance between the first and second pads 31 and 32 is smaller than the distance between the first and second mounting pads 41 and 42. For example, if the distance between the first and second mounting pads is 0.3 millimeters, then the distance between the first and second pads 31 and 32 can advantageously be less than 0.3 millimeters, for example, 0.2 millimeters or 0.1 millimeter. An excess reduction of the distance between the first and second pads 11 and 12 can disturb the operation of the test. A typical example of the minimum distance may be, but is not limited to, approximately 0.1 millimeter.

Fourth Embodiment

Figure 9A:
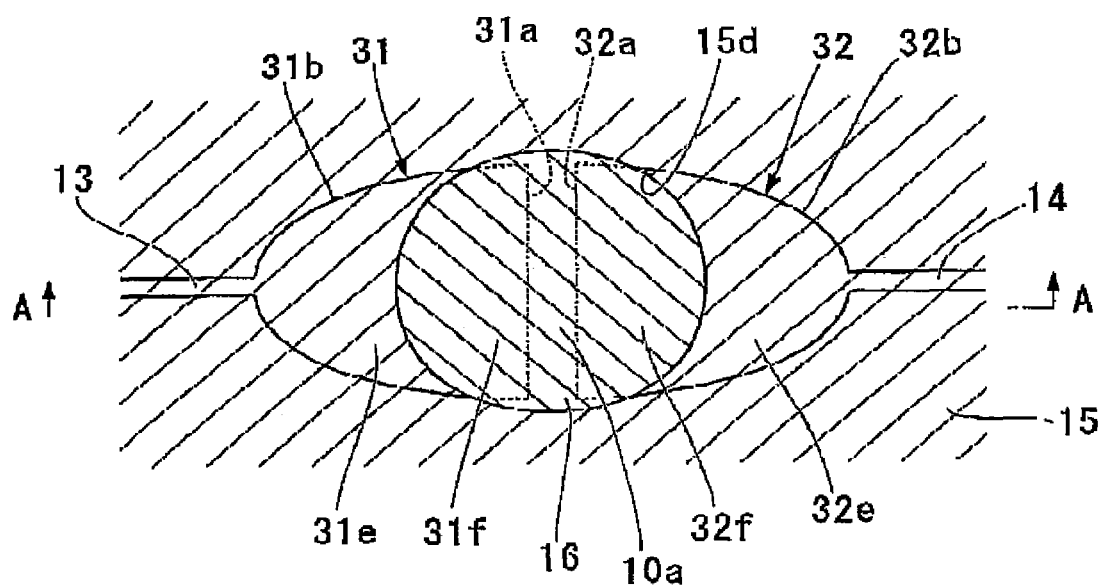
FIG. 9A is a fragmentary perspective plan view illustrating a circuit board including a pad structure in accordance with a fourth embodiment of the present invention.
Figure 9B:
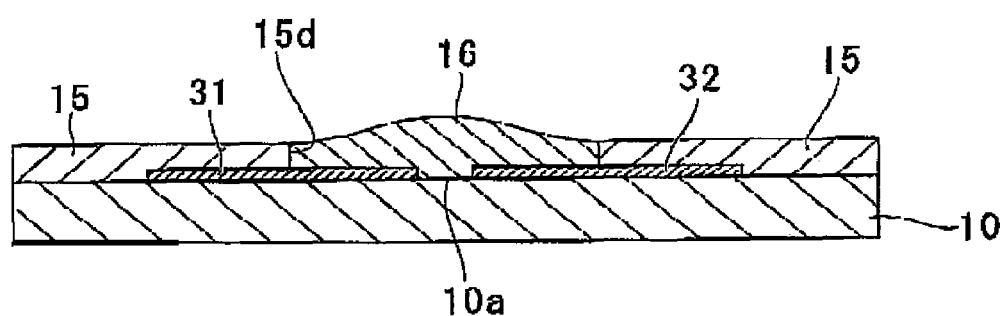
FIG. 9B is a fragmentary cross sectional elevation view, taken along an A-A line of FIG. 9A.

FIG. 9A is a fragmentary perspective plan view illustrating a circuit board including a pad structure in accordance with a fourth embodiment of the present invention. FIG. 9B is a fragmentary cross sectional elevation view, taken along an A-A line of FIG. 9A. The same reference numbers are allocated to the same elements between the first, second and third embodiments shown in FIGS. 1A, 1B, 7A, 7B, 8A and 8B. The following descriptions will focus on substantive differences of the fourth embodiment from the first, second and third embodiments. The solder mask 15 shown in FIG. 9A has an opening 15d that has a circular shape that is different from the elliptical shape of the opening 15a of the solder mask 15 shown in FIG. 1A. The solder 16 is selectively placed in the opening 15b of the solder mask 15. The solder 16 provides an electrical bridge connection between the first and second pads 31 and 32.

The first and second pads 31 and 32 are placed so that the first and second straight edges 31a and 32a face to each other but are distanced from each other. The first and second straight edges 31a and 32a extend parallel to each other. Namely, the first and second straight edges 31a and 32a extend in a first horizontal direction that is parallel to a surface of the board 10. The first and second pads 31 and 32 are distanced from each other in a second horizontal direction that is approximately perpendicular to the first horizontal direction. The first and second pads 31 and 32 have first and second semi-major axes that are aligned to each other and are parallel to the second horizontal direction. The first and second pads 31 and 32 also have first and second minor axes that parallel to each other and also parallel to the first horizontal direction.

The first and second wirings 13 and 14 extend on the first and second semi-major axes of the first and second pads 31 and 32. The first and second wirings 13 and 14 extend outwardly from the first and second semi-elliptically curved edges 31b and 32b. The first pad 31 has a first dimension that is defined by a maximum size thereof in the first horizontal direction. The first dimension corresponds to a first length of the first straight edge 31a. The second pad 32 has a second dimension that is defined by a maximum size thereof in the first horizontal direction. The second dimension corresponds to a second length of the second straight edge 32a. The second length of the second straight edge 32a can be equal to the first length of the first straight edge 31a.

The first pad 31 has a third dimension that is defined in the first semi-major axis that is parallel to the second horizontal direction. The third dimension corresponds to the length of the first semi-major axis. The length of the first semi-major axis corresponds to a distance between the first straight edge 31a and a point connecting between the first wiring 13 and the first semi-elliptically curved edge 31b. In other words, the third dimension is measured on the first semi-major axis.

The second pad 32 has a fourth dimension that is defined in the second semi-major axis that is parallel to the second horizontal direction. The fourth dimension corresponds to the length of the first semi-major axis. The length of the first semi-major axis corresponds to a distance between the second straight edge 32a and a point connecting between the second wiring 14 and the second semi-elliptically curved edge 32b. In other words, the fourth dimension is measured on the second semi-major axis.

In a case, the first, second, third and fourth dimensions of the first and second pads 31 and 32 may be, but is not limited to, 0.5 millimeters. A distance between the first and second pads 31 and 32 is defined by a distance between the first and second straight lines 31a and 32a. The distance between the first and second pads 31 and 32 may be, but is not limited to, 0.1 millimeter.

The first pad 31 has a first side portion 31e and a first center portion 31f. The first center portion 31f is defined by the first side portion 31e and the first straight edge 31a. The second pad 32 has a second side portion 32e and a second center portion 32f. The second center portion 12d is defined by the second side portion 12c and the second straight edge 12a.

The solder mask 15 extends over the board 10, the first and second wirings 13 and 14, and the first and second side portions 31e and 32e of the first and second pads 31 and 32. The solder mask 15 has the opening 15a that has a circular shape in plan view. Typically, the opening 15d can have a diameter of approximately 0.6 millimeters. The diameter of the opening 15d is larger than the first, second, third and fourth dimensions of the first and second pads 31 and 32.

The opening 15a extends over the first and second center portions 31d and 32d of the first and second pads 31 and 32 and a first intervening region 10a of the surface of the board 10. The first intervening region 10a is defined between the first and second straight edges 31a and 32a of the first and second pads 31 and 32. Namely, the first intervening region 10a of the surface of the board 10 is positioned between the first and second center portions 31f and 32f of the first and second pads 31 and 32. The opening 15a has a center that is positioned at a center of the first intervening region 10a.

The solder 16 is provided in the opening 15a so that the solder 16 extends over the first and second center portions 31d and 32d of the first and second pads 31 and 32 and the first intervening region 10a of the surface of the board 10. The solder 16 is electrically conductive. The first and second pads 31 and 32 are electrically connected to each other through the solder 16. In other words, the first and second pads 31 and 32 are bridge-connected to each other by the solder 16.

The diameter of the opening 15d is larger than the first and third dimensions of the first and second pads 31 and 32 so as to ensure a sufficient contact area between the solder 16 and the first and second pads 31 and 32. The reason why the opening 15d of the solder mask 15 has the circular shape is the same as described above with reference to the second embodiment. Namely, the circular shape of the opening 15d can be adopted taking into account a surface tension of the solder 16 in the reflow process for electrically connecting the first and second pads 31 and 32. In the reflow process, the solder 16 is liquefied. The surface tension of the liquefied solder 16 causes a concentration of the liquefied solder 16 at a center of the opening 15d. The center of the opening 15d is positioned in the first intervening region 10a of the surface of the board 10. The surface of the board 10 is poor applicability of the liquefied solder 16 as compared to the surface of the first and second pads 31 and 32. The poor applicability of the first intervening region 10a can facilitate that the liquefied solder 16 expands between the first and second center portions 31f and 32f of the first and second pads 31 and 32. In view of facilitating that the reflow solder 16 expands to fill up the opening 15b of the solder mask 15, it is preferable that the opening 15b has a circle shape in plan view. The circle shape of the opening 15b reduces the contact area of the first and second pads 31 and 32, namely the area of the first and second center portions 31f and 32f of the first and second pads 31 and 32. In view of both ensuring a large contact area of the first and second pads 31 and 32 and facilitating the reflow solder 16 to fill up the opening 15b, the elliptical shape of the opening 15b can be better.

The first and second pads 31 and 32 can be formed in the same manner as described in the first embodiment of the present invention. The mask stencil such as a metal mask stencil that has an elliptically shaped opening can be used to selectively apply or place the solder cream on the board 10. The dimensions of the elliptically shaped opening of the mask stencil can be determined based on the dimensions of the first and second pads 31 and 32.

In accordance with the fourth embodiment, the distance between the first and second pads 31 and 32 is narrow and may be, but is not limited to, approximately 0.1 millimeter.

The conductive material electrically connects the first and second pads 31 and 32. In other words, the conductive material provides an electrical bridge between the first and second pads 31 and 32. The conductive material may be realized by, but is not limited to, a solder 16. The conductive material extends within the opening 15a of the solder mask 15. The conductive material such as the solder 16 extends over the first and second center portions 31f and 32f of the first and second pads 31 and 32, and also over the first intervening region 10a of the surface of the board 10. The provision of the conductive material allows no provision of any zero-ohm resistance. The above-described structure can reduce the number of the parts or elements that are mounted on the board 10. No provision of the zero-ohm resistance means that any process for mounting the zero-ohm resistance is not carried out. No provision of the zero-ohm resistance can reduce the defective rate due to no defects itself or of mounting the same. No provision of the zero-ohm resistance can reduce the cost of the circuit board. No provision of the zero-ohm resistance can improve the yield of the circuit board.

After the solder 16 has been removed from the board 10, the first and second pads 31 and 32 can be used as a test point, thereby facilitating the accomplishment of the test of the circuit board.

The conductive material such as the solder 16 can be selectively provided simply using the mask stencil 20 such as the metal mask stencil in order to provide a bridge connection between the first and second pads 31 and 32. Advantageously, a modified mask stencil can be used to selectively and simultaneously provide both the conductive material such as the solder 16 and another conductive material such as another solder that electrically connects other elements over the board 10.

The above described first embodiment can of course be modified. The first and second pads 31 and 32 can be modified in dimension and shape. The opening 15a of the solder mask 15 can also be modified in dimension and shape. The shape of the opening 15a is defined by the shape of the opening 20a of the mask stencil 20. The shape of the opening 15a can be either similar to or different from the external peripheral shape of the set of the first and second pads.

As described above, the first and second straight edges 31a and 32a can advantageously extend in the first horizontal direction that is perpendicular to the second horizontal direction along which the first and second wirings 13 and 14 extend outwardly from the first and second pads 31 and 32. The first and second pads 31 and 32 can advantageously be modified so that the first and second straight lines 31a and 32a extend in a different horizontal direction from the first and second horizontal directions.

The distance between the first and second pads 31 and 32, for example, the distance between the first and second straight edges 31a and 32a can advantageously be, but is not limited to, approximately 0.1 millimeter. The distance between the first and second pads 31 and 32 can advantageously be adapted as long as the distance between the first and second pads 31 and 32 is smaller than the distance between the first and second mounting pads 41 and 42. For example, if the distance between the first and second mounting pads is 0.3 millimeters, then the distance between the first and second pads 31 and 32 can advantageously be less than 0.3 millimeters, for example, 0.2 millimeters or 0.1 millimeter. An excess reduction of the distance between the first and second pads 11 and 12 can disturb the operation of the test. A typical example of the minimum distance may be, but is not limited to, approximately 0.1 millimeter.

MODIFICATIONS

The circuit boards described in the foregoing embodiments can advantageously be modified in the following points of view. In accordance with one aspect of the present invention, a circuit board may include a board, a first conductive pad over the board, a second conductive pad over the board, a resist extending over the board, and a conductive material within the opening. The second conductive pad is distanced from the first conductive pad. The solder mask has an opening that extends over at least a portion of the first conductive pad, at least a portion of the second conductive pad, and at least a portion of an intervening region of the board. The intervening region extends between the first and second conductive pads. The conductive material extends over the at least a portion of the intervening region, the at least a portion of the first conductive pad, and the at least a portion of the second conductive pad.

In accordance with the first embodiment, as shown in FIG. 1A, the opening 15a extends over parts of the first and second pads 11 and 12 and the first intervening region 10a of the surface of the board 10. In accordance with the second embodiment, as shown in FIG. 7A, the opening 15b extends over parts of the first and second pads 11 and 12 and the first intervening region 10a of the surface of the board 10. In accordance with the third embodiment, as shown in FIG. 8A, the opening 15c extends over entireties of the first and second pads 31 and 32 and the first intervening region 10a of the surface of the board 10. In accordance with the fourth embodiment, as shown in FIG. 9A, the opening 15d extends over parts of the first and second pads 31 and 32 and the first intervening region 10a of the surface of the board 10.

Preferably, the conductive material can be reflowable. The reflowable conductive material can easily fill up completely the opening of the solder mask by using the reflow process, so that the conductive material can be spread and defined by the shape of the opening of the solder mask. Namely, the shape of the opening of the solder mask defines the shape of the reflowable conductive material. The reflowable conductive material may typically include, but is not limited to, the solder.

As described in the foregoing embodiments, preferably, the circuit board may further include a first mounting pad on the board, and a second mounting pad on the board. The first mounting pad is distanced from the first and second conductive pads. The second mounting pad is distanced from the first mounting pad and the first and second conductive pads. A first distance between the first and second conductive pads is narrower than a second distance between the first and second mounting pads so as to promote that a reflow conductive material having a surface tension bridges between the first and second conductive pads in the reflow process. The narrower distance between the first and second conductive pads needs a narrower mounting area than a mounting area needed for mounting the above-described zero-ohm resistance. Causing the conductive material to bridge or electrically connect the first and second conductive pads provides or ensures a test point.

Typically, the opening may have a first center axis and a second center axis that is perpendicular to the first center axis. The opening may have a circumference that is defined by a locus of points having a third distance from the second center axis and a fourth distance from the first center axis. The third distance is defined in parallel to the first center axis. The fourth distance is defined in parallel to the second center axis. The third distance simply decreases while the fourth distance simply increases. The third distance simply increases while the fourth distance simply decreases. Satisfying those conditions for the shape of the opening can facilitate the reflow conductive material to be spread and fill up the opening. Typically, the first and second center axes may cross to each other at a center position that is positioned in the intervening region. Typically, the opening may have, but is not limited to, a circular shape or an elliptical shape.

APPLICABILITY

Figure 10:
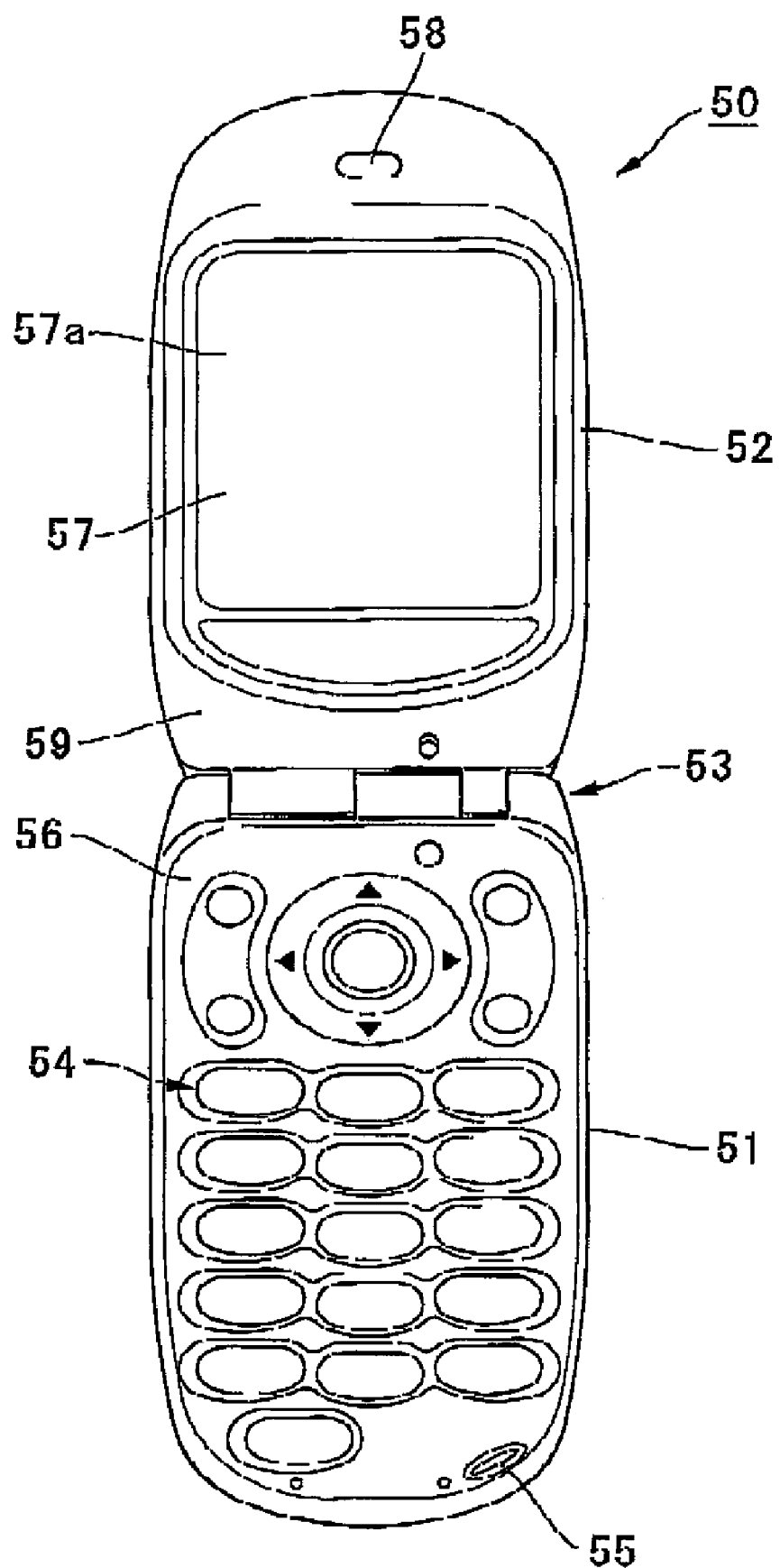
FIG. 10 is a front view illustrating a cellular phone including a circuit board in accordance with each of the first to fourth embodiments of the present invention.

The circuit boards described in the foregoing embodiments can advantageously be applied to a variety of electronic devices. A typical example of the electronic device may include, but is not limited to, a wireless communication device such as a mobile phone or a cellular phone. FIG. 10 is a front view illustrating a cellular phone including a circuit board in accordance with each of the first to fourth embodiments of the present invention. A folding cellular phone 50 may include first and second bodies 51 and 52 and a hinge-connector 53 that hinge-connect the first and second bodies 51 and 52 to each other. Namely, the hinge connector 53 is configured to mechanically and electrically connect the first and second bodies 51 and 52 to each other. The hinge connector 53 is also configured to fold the cellular phone 50 so that the first and second bodies 51 and 52 rotate relative to each other around the hinge-connector 53. The first body 51 has a first front surface 56 and a first back surface that is opposite to the first front surface 56. The second body 52 has a second front surface 59 and a second back surface that is opposite to the second front surface 59. When the cellular phone 50 is completely folded, then the first and second front surfaces 56 and 59 face to each other and are close to each other.

The first body 51 may include an operating unit and an acoustic-to-electric transducer that converts sound into an electrical signal. A typical example of the acoustic-to-electric transducer may include, but is not limited to, a microphone 55. The operating unit may include a variety of operating keys 54 such as a cell key, an end key, ten keys, and software keys. The first front surface 56 of the first body 51 includes exposed surfaces of the operating keys 54 and the microphone 55.

The second body 52 may include a display unit 57 and an electric-to-acoustic transducer such as a speaker 58. The display unit 57 includes a display screen 57a. Typical examples of the display unit 57 may include, but are not limited to, a liquid crystal display and an organic EL display. The second front surface 59 of the second body 52 includes the display screen 57a and an exposed surface of the speaker 58.

The display unit 57 can be configured to display information related to a communication state between the cellular phone 50 and a base station that is not illustrated. The display unit 57 can also be configured to further display information related to contents of operations of the operating keys 54. The display unit 57 can also be configured to furthermore display other information such as an e-mail. The shape of the display screen 57a can generally be, but is not limited to, a rectangle. The microphone 55 and the speaker 58 can be used to perform bidirectional wireless communications through an antenna of the cellular phone, a music replay, and a voice recording. The first body 51 has a side surface on which a connector for an earphone-microphone can be provided. The earphone-microphone has a microphone, a speaker and an operating unit. The earphone-microphone is not illustrated. The above described circuit board can be accommodated in each of the first and second bodies 50 and 51 of the foldable cellular phone. Typical examples of the electronic device that includes at least one circuit board described above may include, but are not limited to, the above-described foldable cellular phone, non-foldable cellular phones, personal handyphone systems (PHS), personal digital assistants (PDA), and a personal computer.

As used herein, the following directional terms "outward, forward, rearward, above, downward, vertical, horizontal, perpendicular, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," "generally" and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A circuit board used for reflow soldering, comprising:
a board;
a first conductive pad provided on the board;
a second conductive pad provided with a first distance from the first conductive pad;
a mask covering a surface of the board, the mask having an opening, the opening extending over the first conductive pad, the second conductive pad and an intervening region of the board between the first and second conductive pads; and
a reflowed solder that fills the opening, the reflowed solder extending over the first conductive pad, the second conductive pad and the intervening region, the reflowed solder connecting the first conductive pad and the second conductive pad, wherein
the opening is substantially elliptical in shape,
the intervening region is positioned at a center region of the opening in a longitudinal direction of the opening,
the first and second conductive pads are positioned at opposite side regions of the opening in the longitudinal direction, and
the first and second conductive pads respectively have first and second edges that confront each other and that are straight and parallel to each other, wherein
the first conductive pad and the second conductive pad are semi-elliptical in shape.

2. The circuit board according to claim 1, wherein the opening comprises first and second areas which are positioned over the first and second conductive pads, respectively, a third area which is positioned over the intervening region of the board, and the third area is wider than the first and second areas in a direction perpendicular to the longitudinal direction.

3. circuit board according to claim 2, wherein
the first and second areas of the opening have first and second lengths in the direction perpendicular to the longitudinal direction, and the third area of the opening has a third length in the longitudinal direction that is shorter than the first and second lengths.

4. The circuit board according to claim 1, wherein the opening comprises first and second areas which are positioned over the first and second conductive pads, respectively, the first area is smaller than the first conductive pad, the second area is smaller than the second conductive pad.

5. The circuit board according to claim 1, further comprising:

a first mounting pad provided on the board; and a second mounting pad provided with a second distance from the first conductive pad, wherein the first distance is shorter than the second distance.

6. The circuit board according to claim 1, wherein the surface of the board is lower in applicability of the reflowed solder than the surfaces of the first and second conductive pads.

* * * * *